(12) United States Patent
Lai et al.

(10) Patent No.: US 11,917,762 B2
(45) Date of Patent: Feb. 27, 2024

(54) CIRCUIT BOARD MODULE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 121 days.

(21) Appl. No.: 17/694,720

(22) Filed: Mar. 15, 2022

(65) Prior Publication Data
US 2023/0180389 A1 Jun. 8, 2023

(30) Foreign Application Priority Data
Dec. 8, 2021 (TW) .................................. 110145767

(51) Int. Cl.
*H05K 5/02* (2006.01)
*H05K 1/18* (2006.01)
(Continued)

(52) U.S. Cl.
CPC ............ *H05K 1/181* (2013.01); *H01H 13/14* (2013.01); *H01H 13/20* (2013.01); *H05K 2201/10053* (2013.01)

(58) Field of Classification Search
CPC .. H05K 5/00; H05K 5/04; H05K 5/06; H05K 7/14; H05K 7/1421; H05K 1/18;
(Continued)

(56) References Cited

U.S. PATENT DOCUMENTS 4,159,861 A 7/1979 Anhalt
5,815,377 A * 9/1998 Lund .................... H01R 12/722
361/756
(Continued)

FOREIGN PATENT DOCUMENTS

CN 108352660 7/2018
EP 2793245 10/2014
(Continued)

OTHER PUBLICATIONS

"Office Action of Taiwan Counterpart Application", dated May 3, 2022, p. 1-p. 3.
(Continued)

*Primary Examiner* — Tuan T Dinh
(74) *Attorney, Agent, or Firm* — JCIPRNET

(57) ABSTRACT

A circuit board module includes a circuit board body, a connector, a press button, a bracket, and a linkage. The connector includes a base and a rotating button rotatably disposed on the base. The press button is located away from the connector. The bracket includes a first limiting portion. The linkage is located between the rotating button and the press button and includes a second limiting portion corresponding to the first limiting portion, a first segment, and a second segment linked to the first segment. The first segment extends along a first axis and is linked to the rotating button. The second segment extends along a second axis and is linked to the press button. One of the second limiting portion and the first limiting portion extends along the first axis. The first segment is movably disposed on the bracket along the first axis.

9 Claims, 5 Drawing Sheets

(51) Int. Cl.
*H01H 13/14* (2006.01)
*H01H 13/20* (2006.01)

(58) Field of Classification Search
CPC .......... H05K 1/181–184; H01H 13/14; H01H 13/20; H01H 13/18; G06F 1/18; G06F 1/185–186
USPC .............. 361/752–759, 801–802; 312/223.2
See application file for complete search history.

(56) References Cited

U.S. PATENT DOCUMENTS

| | | | |
|---|---|---|---|
| 6,406,309 B1 | 6/2002 | Ennis et al. | |
| 8,422,216 B2* | 4/2013 | Liang | G06F 1/183 361/801 |
| 2008/0183933 A1 | 7/2008 | Peng et al. | |
| 2008/0259582 A1* | 10/2008 | Cheng | G06F 1/185 361/801 |
| 2012/0300384 A1* | 11/2012 | Alo | G06F 1/187 361/752 |
| 2015/0131227 A1* | 5/2015 | Howell | G06F 1/185 211/26 |
| 2018/0090862 A1 | 3/2018 | Li et al. | |
| 2019/0075666 A1* | 3/2019 | Ehlen | H05K 7/1487 |
| 2020/0310500 A1 | 10/2020 | Mao et al. | |
| 2021/0352818 A1 | 11/2021 | Chang et al. | |

FOREIGN PATENT DOCUMENTS

| | | |
|---|---|---|
| TW | M251200 | 11/2004 |
| TW | 201108513 | 3/2011 |
| TW | M438551 | 10/2012 |
| TW | M518839 | 3/2016 |
| TW | I610502 | 1/2018 |
| TW | M595343 | 5/2020 |
| TW | M610315 | 4/2021 |
| TW | M611095 | 5/2021 |

OTHER PUBLICATIONS

"Office Action of Taiwan Related Application, Application No. 111133307", dated Mar. 20, 2023, p. 1-p. 6.
"Search Report of Europe Counterpart Application", dated Apr. 13, 2023, p. 1-p. 9.
"Office Action of Taiwan Related Application, Application No. 111137168", dated Jun. 6, 2023, p. 1-p. 6.
"Search Report of Europe Related Application, Application No. 22209523.4", dated Jul. 17, 2023, p. 1-p. 10.

* cited by examiner

CIRCUIT BOARD MODULE

CROSS-REFERENCE TO RELATED APPLICATION

This application claims the priority benefit of Taiwan application serial no. 110145767, filed on Dec. 8, 2021. The entirety of the above-mentioned patent application is hereby incorporated by reference herein and made a part of this specification.

BACKGROUND

Technical Field

The present disclosure relates to a circuit board module, particularly to a circuit board module capable of driving a rotating button of a connector with a remote button.

Description of Related Art

Currently, the rotating button of a PCI-E connector is located at the end of the connector. By pressing the rotating button, the expansion card inserted in the PCI-E connector may be lifted. However, with the advancement of technology, the motherboard are inserted with high-efficiency heat sinks or elements with new functions, making it difficult for users to directly press the rotating button of the PCI-E connector, causing difficulties in use.

SUMMARY

The disclosure provides a circuit board module capable of driving a rotating button of a connector with a remote button.

A circuit board module of the disclosure includes a circuit board body, a connector, a press button, a bracket, and a linkage. The connector is disposed on the circuit board body, and includes a base and a rotating button rotatably disposed on the base. The press button is located on the circuit board body and away from the connector. The bracket is disposed on the circuit board body and includes a first limiting portion. The linkage is located between the rotating button and the press button, and includes a second limiting portion corresponding to the first limiting portion, a first segment, and a second segment linked to the first segment. The first segment extends along a first axis and is linked to the rotating button. The second segment extends along a second axis and is linked to the press button. One of the second limiting portion and the first limiting portion extends along the first axis, so that the first segment is movably disposed on the bracket along the first axis. In response to the press button being pressed, the second segment of the linkage is driven, and the first segment is linked to move along the first axis, and the rotating button is pulled to rotate relative to the base.

In an embodiment of the disclosure, the press button includes a first abutment area facing the second segment, the second segment includes a second abutment area corresponding to the first abutment area, and at least one of the first abutment area and the second abutment area is inclined.

In an embodiment of the disclosure, one of the second limiting portion and the first limiting portion is a first elongated hole or a first elliptical hole extending along the first axis, the other one of the second limiting portion and the first limiting portion is a first protruding post, and the first protruding post is located in the first elongated hole or the first elliptical hole.

In an embodiment of the disclosure, the first protruding post is an elliptical column, a long column or a cylinder, and the length of the first elongated hole or the first elliptical hole is greater than the maximum width of the first protruding post.

In an embodiment of the disclosure, the rotating button includes a second protruding post, the first segment includes a second elongated hole or a second elliptical hole, and the second protruding post is located in the second elongated hole or the second elliptical hole, so that the rotating button is linked to the first segment.

In an embodiment of the disclosure, in response to the press button not being pressed, the second protruding post is close to one end in the second elongated hole or the second elliptical hole, and in response to the press button being pressed, the second protruding post is close to the other end in the second elongated hole or the second elliptical hole.

In an embodiment of the disclosure, the second elongated hole or the second elliptical hole extends along a third axis, and the third axis has a component in a normal direction of the circuit board body.

In an embodiment of the disclosure, the press button is movably disposed on the bracket along a third axis, the bracket comprises a stopper, the press button comprises a slider, and the stopper restricts a movement of the slider in the third axis.

In an embodiment of the disclosure, the circuit board module further includes an elastic member disposed between the bracket and the press button.

In an embodiment of the disclosure, in response to the press button being pressed along a third axis, the entire linkage is driven to move along the first axis, and then the rotating button is pulled to rotate in the direction of the circuit board body.

Based on the above, the press button of the circuit board module of the disclosure is located on the circuit board body and away from the connector. The linkage is located between the rotating button and the press button. The first segment of the linkage extends along the first axis and is linked to the rotating button. The second segment of the linkage extends along the second axis and is linked to the press button, so that the rotating button may be driven by the press button through the linkage. In addition, one of the first limiting portion of the bracket and the second limiting portion of the linkage extends along the first axis, so that the first segment is movably disposed on the bracket along the first axis. In other words, the bracket restricts the movement of the linkage along the first axis. In response to the press button being pressed, the second segment of the linkage is driven, and the first segment is linked to move along the first axis, and then the rotating button is pulled to rotate the rotating button relative to the base. Therefore, the rotating button of the connector may be smoothly driven by a remote button.

DESCRIPTION OF THE EMBODIMENTS

Figure 1:
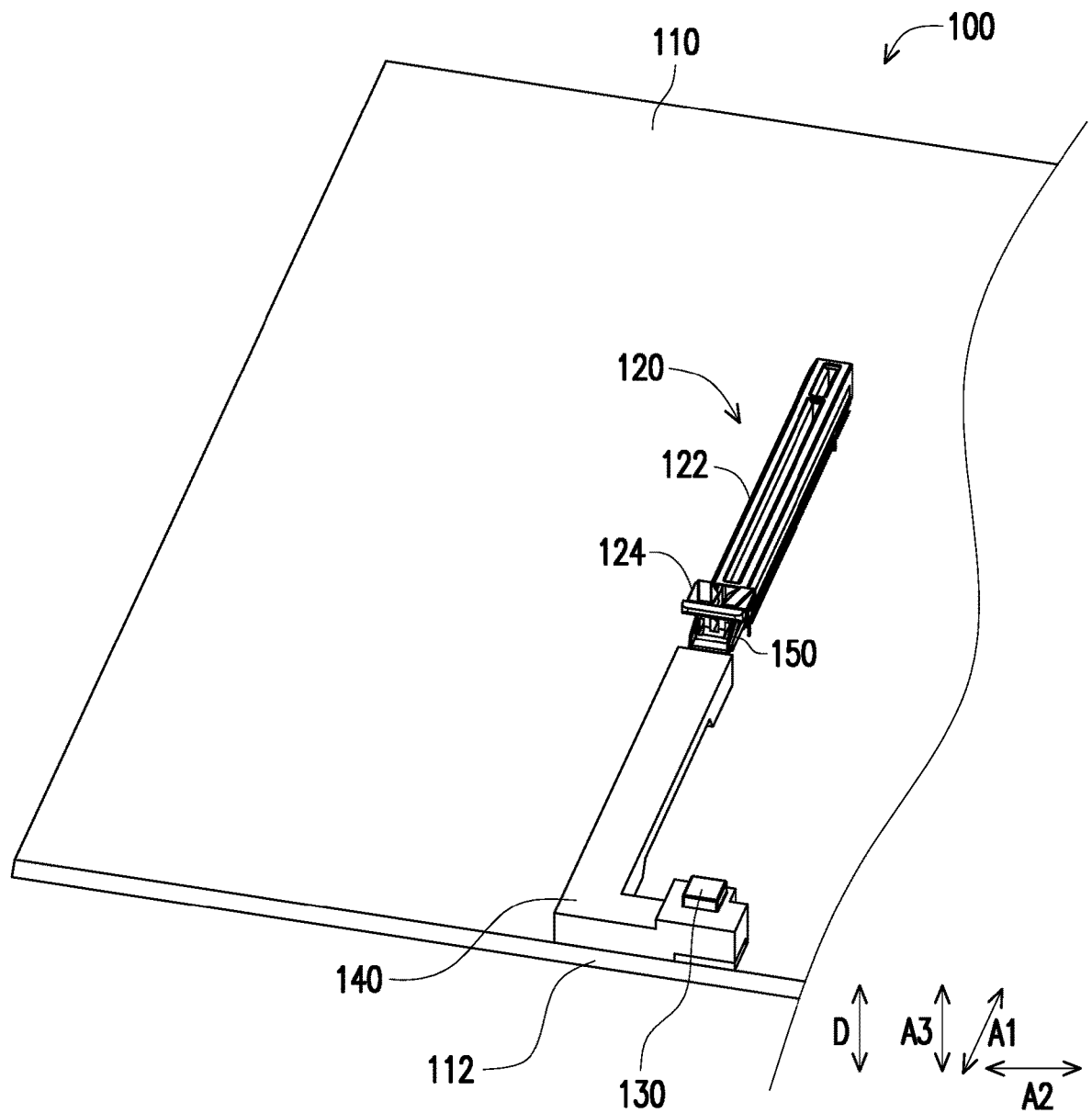
FIG. 1 is a partial schematic diagram of a circuit board module according to an embodiment of the disclosure.
Figure 2:
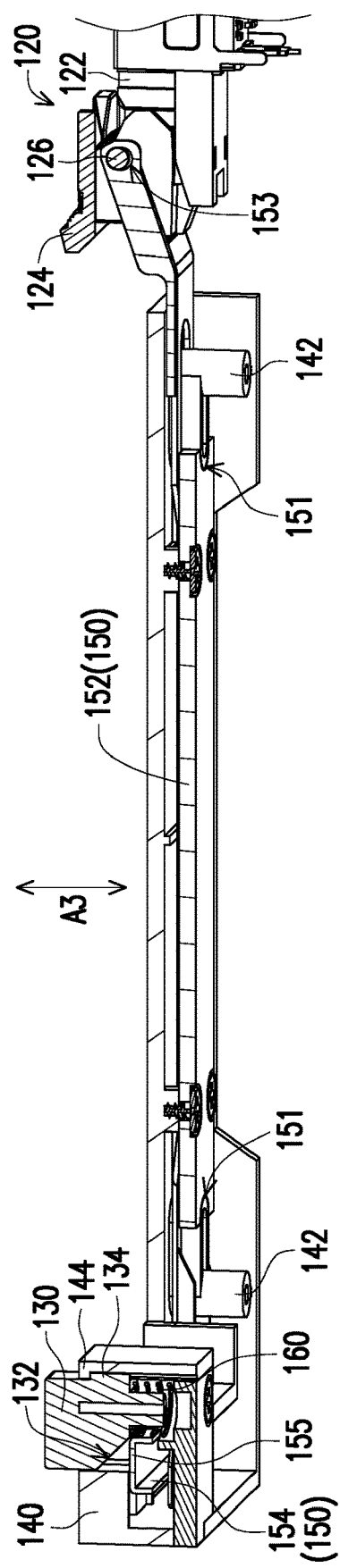
FIG. 2 is a schematic perspective cross-segmental view of the press button, the bracket, the linkage, and part of the connector when the press button of FIG. 1 has not been pressed.

FIG. 1 is a partial schematic diagram of a circuit board module according to an embodiment of the disclosure. In FIG. 1, a circuit board module 100 of this embodiment includes a circuit board body 110, a connector 120, a press button 130, a bracket 140, and a linkage 150 (FIG. 2). The connector 120 is disposed on the circuit board body 110. The connector 120 includes a base 122 and a rotating button 124 rotatably disposed on the base 122.

In this embodiment, the connector 120 is, for example, a PCI-E connector, but the type of the connector 120 is not limited thereto. The connector 120 is suitable to be inserted with a graphics card (not shown). Since the graphics card generates high heat during operation, it is usually equipped with large-sized heat sink fins and fans, which may easily cover the rotating button 124, which makes it difficult for the user to remove the graphics card by turning the rotating button 124 directly.

In this embodiment, the press button 130 is located on the circuit board body 110 and away from the connector 120. The press button 130 is closer to an edge 112 of the circuit board body 110 than the rotating button 124 is. Specifically, the bracket 140 is disposed on the circuit board body 110. The press button 130 is movably disposed on the bracket 140 along a third axis A3, and the press button 130 is located on the edge 112 of the circuit board body 110.

Since the edge 112 of the circuit board body 110 tends not to be configured with a large element, the press button 130 may be prevented from being shielded by other components by arranging the press button 130 on the edge 112 of the circuit board body 110. The press button 130 may be linked to the rotating button 124. Therefore, the user may rotate the rotating button 124 by pressing the press button 130 away from the connector 120.

It is worth mentioning that, in this embodiment, the bracket 140 is L-shaped, and the rotating button 124 and the press button 130 are located at different ends of the L-shaped bracket 140. In other words, the press button 130 is not directly disposed on the straight line stretching from the connector 120 to the edge 112 of the circuit board body 110. Instead, it is disposed in an area steering clear from the connector 120 extending directly to the edge 112 of the circuit board body 110. In other words, the rotating button 124 and the press button 130 steer clear on from each other along the first axis A1.

Although only the elements related to this disclosure are shown in FIG. 1, there are many components on the circuit board body 110 in practice. The press button 130 may be disposed in a location outside the circuit layout according to the element configuration of the circuit board body 110, so that the configuration of the press button 130 on the circuit board body 110 is more flexible.

Figure 3:
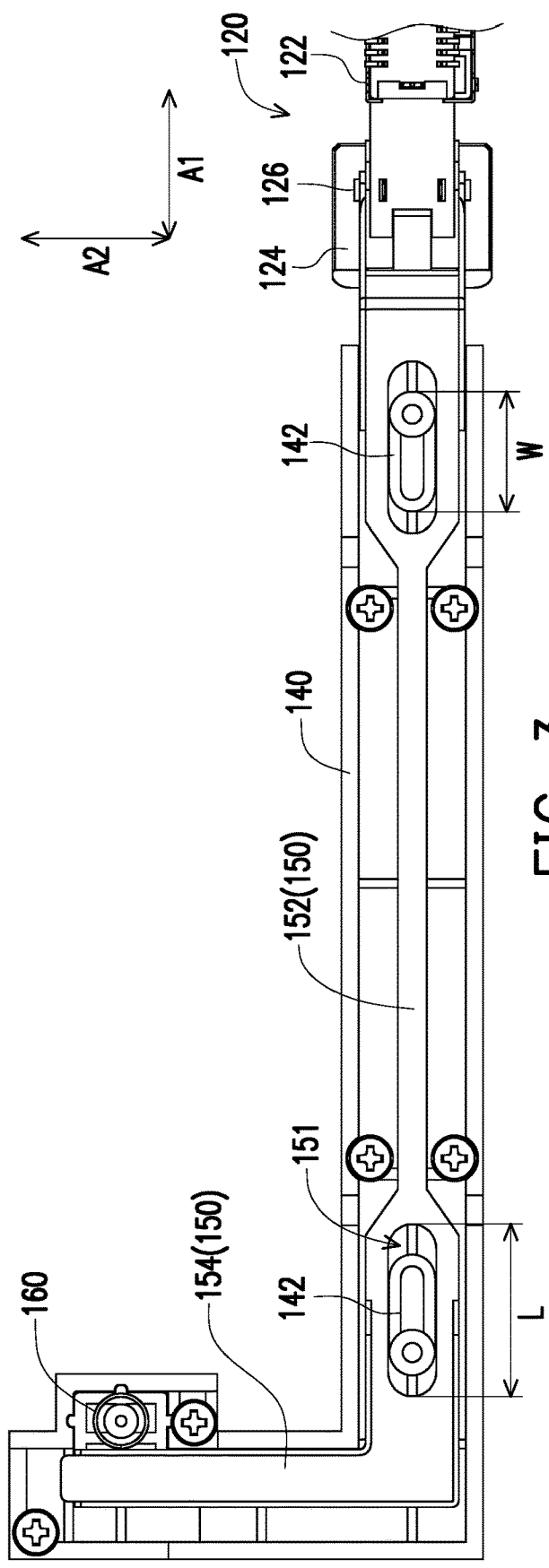
FIG. 3 is a schematic bottom view of the press button, the bracket, the linkage, and part of the connector when the press button of FIG. 1 has not been pressed.

FIG. 2 is a schematic perspective cross-segmental view of the press button, the bracket, the linkage, and part of the connector when the press button of FIG. 1 has not been pressed. FIG. 3 is a schematic bottom view of the press button, the bracket, the linkage, and part of the connector when the press button of FIG. 1 has not been pressed.

In FIG. 2 and FIG. 3, the linkage 150 is located between the rotating button 124 and the press button 130, and the press button 130 allows the rotating button 124 to move through the linkage 150. The linkage 150 includes a first segment 152 and a second segment 154 linked to the first segment 152. In this embodiment, the first segment 152 is fixed to the second segment 154, and the first segment 152 and the second segment 154 are, for example, integrated. In other embodiments, the first segment 152 may also be screwed to the second segment 154.

As shown in FIG. 3, the first segment 152 of the linkage 150 extends along a first axis A1 and is linked to the rotating button 124, and the second segment 154 of the linkage 150 extends along a second axis A2 and is linked to the press button 130. In this embodiment, the first axis A1 is perpendicular to the second axis A2, so that the linkage 150 is L-shaped, but the relative relationship between the first axis A1 and the second axis A2 is not limited thereto.

As may be seen from the left side of FIG. 2, the press button 130 includes a first abutment area 132 facing the second segment 154, and the second segment 154 includes a second abutment area 155 corresponding to the first abutment area 132. In this embodiment, the first abutment area 132 is inclined. The inclined first abutment area 132 may be adapted to change the direction of movement.

Figure 4:
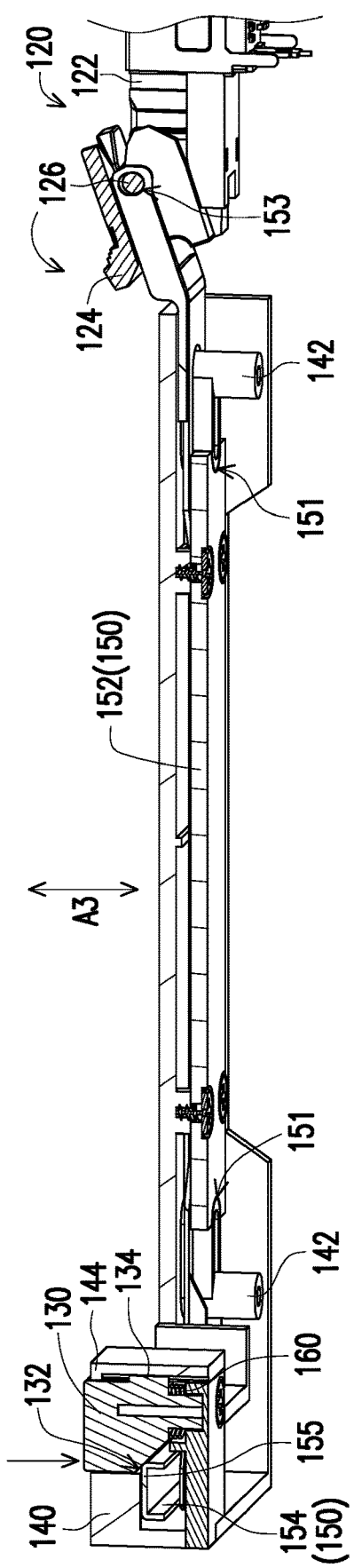
FIG. 4 is a three-dimensional cross-segmental schematic diagram of the press button, the bracket, the linkage, and part of the connector when the press button of FIG. 1 is pressed.
Figure 5:
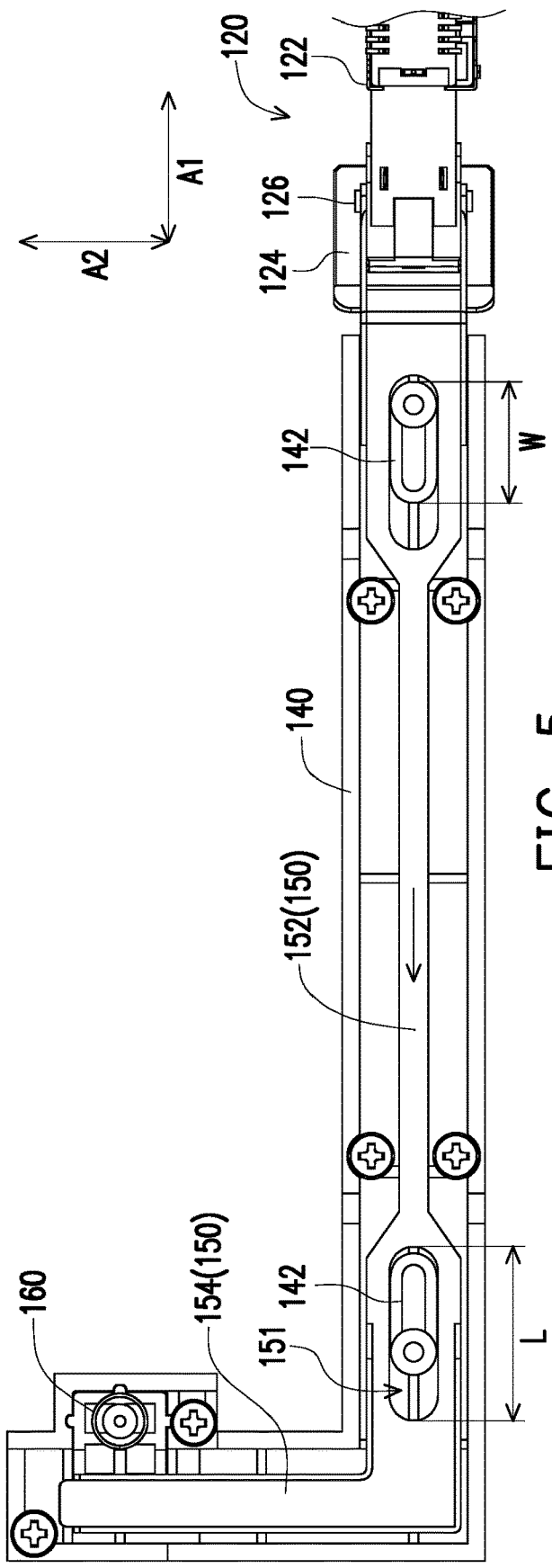
FIG. 5 is a schematic bottom view of the press button, the bracket, the linkage, and part of the connector when the press button of FIG. 1 is pressed.

FIG. 4 is a three-dimensional cross-segmental schematic diagram of the press button, the bracket, the linkage, and part of the connector when the press button of FIG. 1 is pressed. FIG. 5 is a schematic bottom view of the press button, the bracket, the linkage, and part of the connector when the press button of FIG. 1 is pressed. In FIG. 4 and FIG. 5, when the press button 130 is pressed along the third axis A3, the inclined first abutment area 132 pushes the edge 112 of the second abutment area 155 of the second segment 154 to drive the second segment 154 of the linkage 150, and the second segment 154 is moved toward the first axis A1 (leftward) as shown in FIG. 5.

Since the first segment 152 is linked to the second segment 154, the first segment 152 is to be driven by the second segment 154 to move along the first axis A1 (leftward). In other words, the entire linkage 150 moves along the first axis A1, and as shown in FIG. 4, the rotating button 124 is pulled to rotate relative to the base 122. The rotating button 124 then rotates in the direction of the circuit board body 110 (FIG. 1).

It should be noted that since the press button 130 and the rotating button 124 are steering clear from each other in the first axis A1, in order to prevent the linkage 150 from rotating when the first abutment area 132 of the press button 130 pushes against the second abutment area 155 of the second segment 154. As shown in FIG. 3 and FIG. 5, in this embodiment, the bracket 140 includes a first limiting portion 142. The linkage 150 includes a second limiting portion 151 corresponding to the first limiting portion 142.

In this embodiment, the first limiting portion 142 of the bracket 140 is, for example, a first protruding post, and the first protruding post is an elliptical column, a long column, or a cylinder. The second limiting portion 151 is, for example, a first elongated hole or a first elliptical hole extending along the first axis A1. The first protruding post is located in the first elongated hole or the first elliptical hole, and the length L of the first elongated hole or the first elliptical hole is greater than the maximum width W of the first protruding post, so that the first segment 152 is movably disposed on the bracket 140 along the first An axis A1.

In this way, when the first abutment area 132 of the press button 130 pushes against the second abutment area 155 of the second segment 154 of the linkage 150, the linkage 150 is guided by the bracket 140 and moves only along the first axis A1 without rotating, and the rotating button 124 is thus driven more stably.

In addition, as shown in FIG. 2 and FIG. 4, the circuit board module 100 further includes an elastic member 160 disposed between the bracket 140 and the press button 130. The elastic member 160 may be adapted to accumulate elastic potential energy after the press button 130 is pressed, and lift the press button 130 up after the user releases their hand.

Furthermore, the bracket 140 further includes a stopper 144, the press button 130 includes a slider 134, and the stopper 144 restricts the movement of the slider 134 in the third axis A3, so as to prevent the press button 130 from being separated from the bracket 140 after the elastic member 160 lifts the press button 130.

Figure 6:
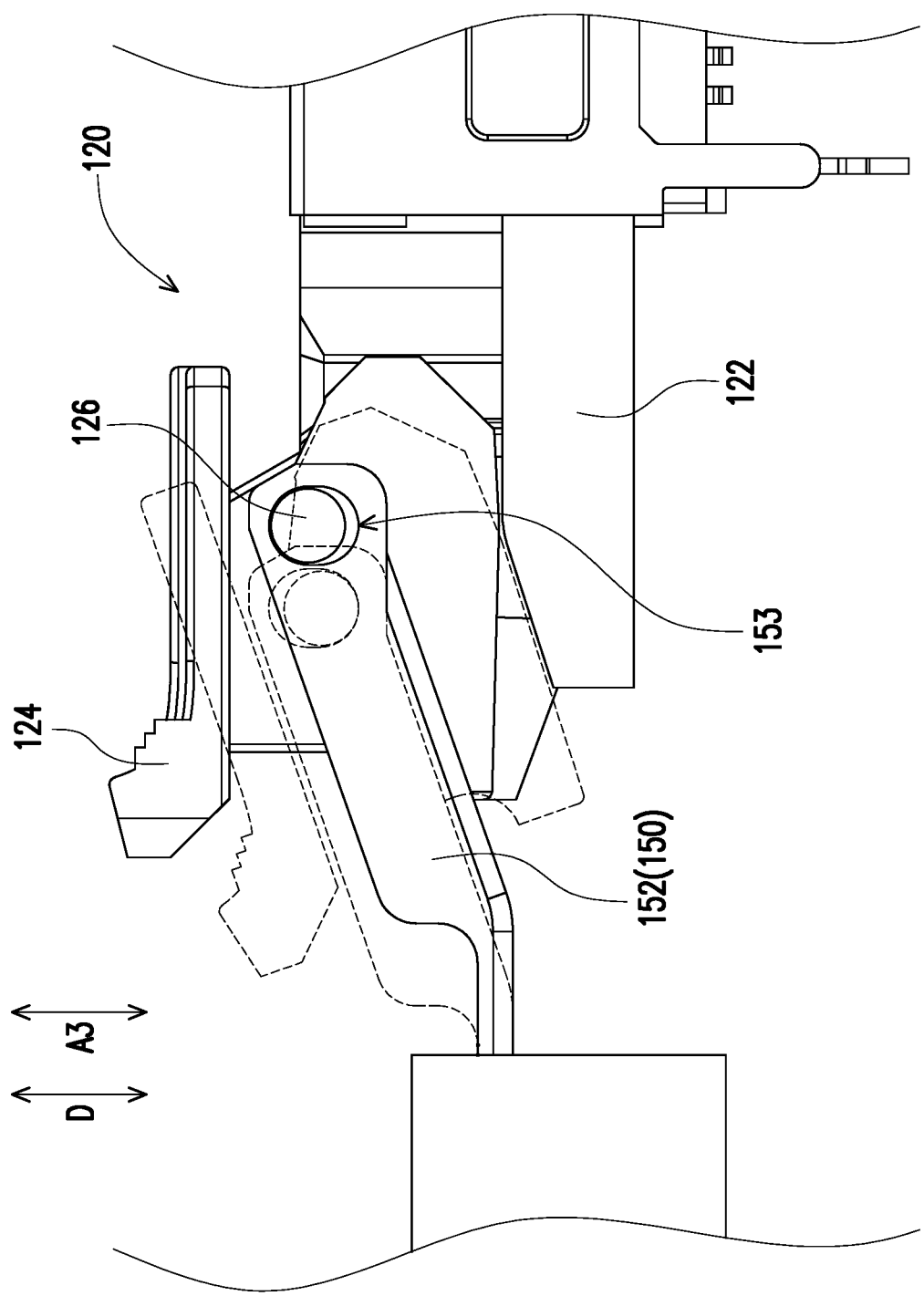
FIG. 6 is a partial side view of the linkage and part of the connector of FIG. 1 before and after actuation.

FIG. 6 is a partial side view of the linkage and part of the connector of FIG. 1 before and after actuation. In FIG. 6, the linkage 150 and the rotating button 124 before actuation are represented by solid lines, whereas the linkage 150 and the rotating button 124 after actuation are represented by dashed lines. In this embodiment, the rotating button 124 includes a second protruding post 126, the first segment 152 includes a second elongated hole or a second elliptical hole 153, and the second protruding post 126 is located in the second elongated hole or the second elliptical hole 153, so that the rotating button 124 is linked to the first segment 152.

It may be seen from FIG. 6 that the second elongated hole or the second elliptical hole 153 extends along the third axis A3, which is different from the first axis A1 and the second axis A2, and the third axis A3 has a component in the normal direction D of the circuit board body 110. Since the rotating button 124 rotates after being driven, the second protruding post 126 of the rotating button 124 also rotates correspondingly, and there is a moving component in the normal direction D of the circuit board body 110.

Therefore, the extension direction (the third axis A3) of the second elongated hole or the second elliptical hole 153 has a component in the normal direction D of the circuit board body 110, and the second protruding post 126 may move in the second elongated hole or the second elliptical hole 153 during the rotation of the rotating button 124. As shown in FIG. 6, when the press button 130 has not been pressed, the second protruding post 126 is close to one end (for example, the upper end) in the second elongated hole or the second elliptical hole 153. When the press button 130 is pressed, the second protruding post 126 is close to the other end (for example, the lower end) in the second elongated hole or the second elliptical hole 153. In other words, such a design prevents the linkage 150 from interfering with the rotation of the rotating button 124.

In this embodiment, the third axis A3 is the same as the normal direction D of the circuit board body 110, but in other embodiments, the third axis A3 may also only have a component in the normal direction of the circuit board body 110.

Figure 7:
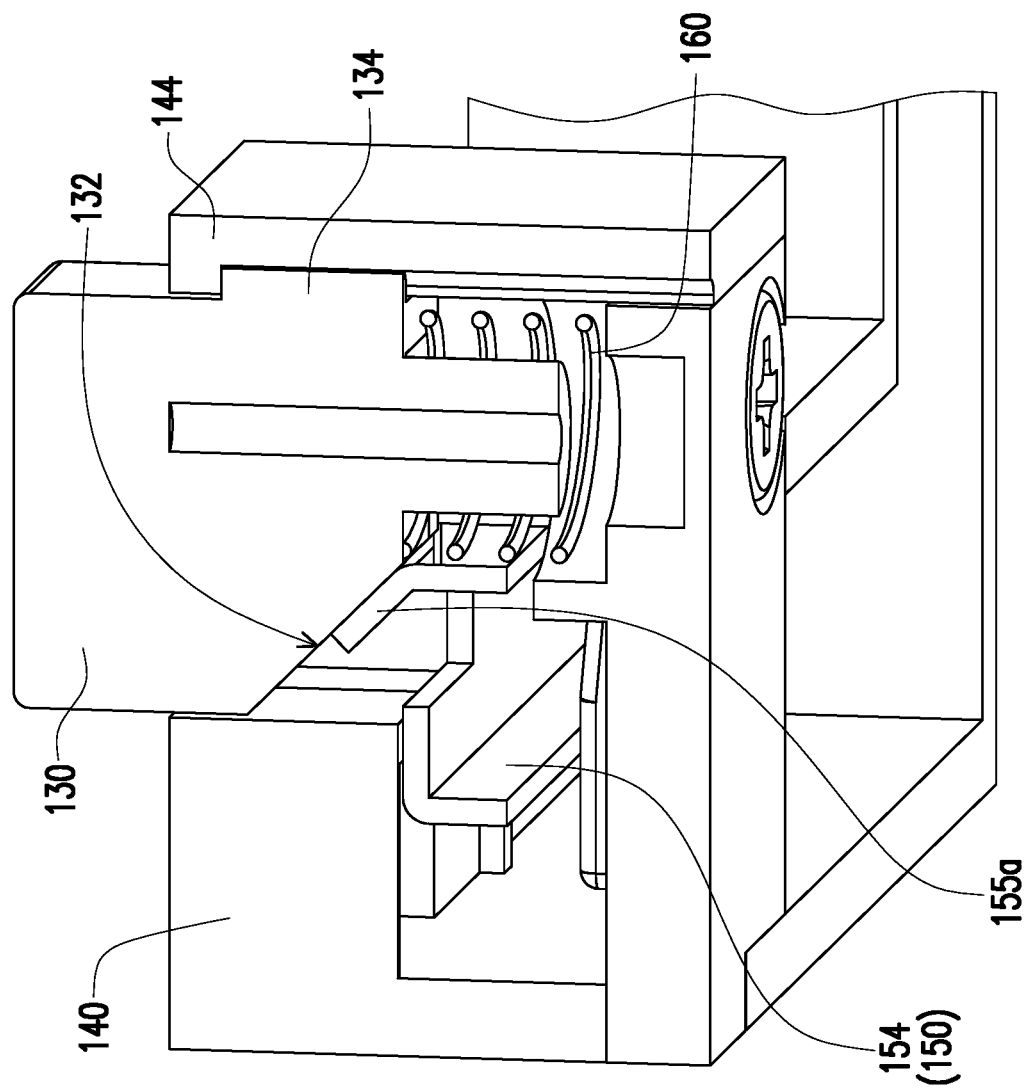
FIG. 7 is a partial enlarged schematic diagram of a circuit board module according to another embodiment of the disclosure.

FIG. 7 is a partial enlarged schematic diagram of a circuit board module according to another embodiment of the disclosure. The main difference between this embodiment of FIG. 7 and the embodiment of FIG. 2 is that, the second abutment area 155a of the second segment 154 in this embodiment is also inclined and corresponds to the first abutment area 132 of the press button 130. When the press button 130 is pressed, the inclined first abutment area 132 pushes the inclined second abutment area 155a, and drives the second segment 154 of the linkage 150 to move the second segment 154 leftward.

In summary, the press button of the circuit board module of the disclosure is located on the circuit board body and away from the connector. The linkage is located between the rotating button and the press button. The first segment of the linkage extends along the first axis and is linked to the rotating button. The second segment of the linkage extends along the second axis and is linked to the press button, so that the rotating button may be driven by the press button through the linkage. In addition, one of the first limiting portion of the bracket and the second limiting portion of the linkage extends along the first axis, so that the first segment is movably disposed on the bracket along the first axis. In other words, the bracket restricts the movement of the linkage along the first axis. In response to the press button being pressed, the second segment of the linkage is driven, and the first segment is linked to move along the first axis, and then the rotating button is pulled to rotate the rotating button relative to the base. Therefore, the rotating button of the connector may be smoothly driven by a remote button.

What is claimed is:

1. A circuit board module, comprising:
 a circuit board body;
 a connector, disposed on the circuit board body and comprising a base and a rotating button rotatably disposed on the base;
 a press button, located on the circuit board body and away from the connector;
 a bracket, disposed on the circuit board body and comprising a first limiting portion; and
 a linkage, located between the rotating button and the press button, and comprising a second limiting portion corresponding to the first limiting portion, a first segment, and a second segment linked to the first segment, wherein the first segment extends along a first axis and is linked to the rotating button, the second segment extends along a second axis and is linked to the press button, and one of the second limiting portion and the first limiting portion extends along the first axis, so that the first segment is movably disposed on the bracket along the first axis,
 wherein in response to the press button being pressed, the second segment of the linkage is driven, and the first segment is linked to move along the first axis and pull the rotating button, and the rotating button is pulled to rotate relative to the base, wherein the press button comprises a first abutment area facing the second segment, the second segment comprises a second abutment area corresponding to the first abutment area, and at least one of the first abutment area and the second abutment area is inclined.

2. The circuit board module as described in claim 1, wherein one of the second limiting portion and the first limiting portion is a first elongated hole or a first elliptical hole extending along the first axis, an other one of the second limiting portion and the first limiting portion is a first protruding post, and the first protruding post is located in the first elongated hole or the first elliptical hole.

3. The circuit board module as described in claim 1, wherein the rotating button comprises a second protruding post, the first segment comprises a second elongated hole or a second elliptical hole, and the second protruding post is located in the second elongated hole or the second elliptical hole, so that the rotating button is linked to the first segment.

4. The circuit board module as described in claim 1, wherein the press button is movably disposed on the bracket along a third axis, the bracket comprises a stopper, the press button comprises a slider, and the stopper restricts a movement of the slider in the third axis.

5. The circuit board module as described in claim 1, further comprising an elastic member disposed between the bracket and the press button.

6. The circuit board module as described in claim 1, wherein in response to the press button being pressed along a third axis, the entire linkage is driven to move along the first axis, and the rotating button is pulled to rotate in a direction of the circuit board body.

7. The circuit board module as described in claim 2, wherein the first protruding post is an elliptical column, a long column or a cylinder, and a length of the first elongated hole or the first elliptical hole is greater than a maximum width of the first protruding post.

8. The circuit board module as described in claim 3, wherein in response to the press button not being pressed, the second protruding post is close to one end in the second elongated hole or the second elliptical hole, and in response to the press button being pressed, the second protruding post is close to an other end in the second elongated hole or the second elliptical hole.

9. The circuit board module as described in claim 3, wherein the second elongated hole or the second elliptical hole extends along a third axis, and the third axis has a component in a normal direction of the circuit board body.

* * * * *